(12) United States Patent
Huang

(10) Patent No.: US 6,833,315 B1
(45) Date of Patent: Dec. 21, 2004

(54) REMOVING SILICON OXYNITRIDE OF POLYSILICON GATES IN FABRICATING INTEGRATED CIRCUITS

(75) Inventor: Jui-Tsen Huang, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/477,110

(22) Filed: Dec. 31, 1999

(51) Int. Cl.⁷ .......................................... H01L 21/3205
(52) U.S. Cl. ..................................... 438/587; 438/592
(58) Field of Search ............................... 438/592, 669, 438/656, 671, 696, 735, 740, 691, 692, 593, 587, 734

(56) References Cited

U.S. PATENT DOCUMENTS

| | | | | |
|---|---|---|---|---|
| 5,700,737 A | * | 12/1997 | Yu | 438/636 |
| 5,856,225 A | * | 1/1999 | Lee | 438/291 |
| 6,074,905 A | * | 6/2000 | Hu | 438/224 |
| 6,103,634 A | * | 8/2000 | Dunton | 438/724 |
| 6,165,881 A | * | 12/2000 | Tao | 438/592 |
| 6,191,046 B1 | * | 2/2001 | Singh | 438/273 |
| 6,200,886 B1 | * | 3/2001 | Yu | 438/585 |

* cited by examiner

*Primary Examiner*—Mary Wilczewski
(74) *Attorney, Agent, or Firm*—Powell, Goldstein, Frazer & Murphy LLP

(57) ABSTRACT

A method for removing silicon oxynitride of polysilicon gates in fabricating integrated circuits is disclosed. First of all, a semiconductor substrate is provided over which a doped polysilicon gate and an undoped polysilicon gate are formed. Second, an oxynitride layer used as an anti-reflective coating (ARC) is formed on the surface of the doped and the undoped polysilicon gates. A photoresist layer is coated over the substrate and the oxynitride layer. A major portion of the surface of undoped polysilicon gate is removed. A portion of the photoresist layer is etched back. The oxynitride layer is dry etched, wherein the doped and the undoped polysilicon gates are protected. The remained photoresist layer is removed. Surfaces of the doped and the undoped polysilicon gates and the substrate are all cleaned.

5 Claims, 5 Drawing Sheets

REMOVING SILICON OXYNITRIDE OF POLYSILICON GATES IN FABRICATING INTEGRATED CIRCUITS

BACKGROUND OF THE INVENTION

1. Field of the Invention

The invention relates to remove silicon oxynitride on semiconductor substrate, more particularly to remove silicon oxynitride without effecting the shape of the gate portions.

2. Description of the Prior Art

Using silicon oxynitride (SiON) as the bottom anti-reflection coating layer for the deep sub-micro device is the well-known process to SRAM technique. Normally, the conventional process can be indicated as the following statement.

First of all, FIG. 1A shows that there semiconductor substrate 10, gate oxide 11, undo-type polysilicon 12, N+ type polysilicon 13 and silicon oxynitride 14 are all provided.

Then, silicon oxynitride 14 is removed by the, hot $H_3PO_4$ solution as FIG. 1B. However, unfortunately it is found at this step that the implanted N+-type polysilicon gate will be damaged by the hot $H_3PO_4$ solution. Especially, shape of the implanted N+-type polysilicon gate is not shown as the purpose shape.

Thus, a new improvement technology is indeed necessary according to the above statement.

SUMMARY OF THE INVENTION

In accordance with the present invention, a method is provided for removing silicon oxynitride that substantially keeps the purpose shape of the underlying gate.

In one embodiment, a method for removing silicon oxynitride of polysilicon gates in fabricating integrated circuits will be the following. A semiconductor substrate is provided over which a doped polysilicon gate and an undoped polysilicon gate are formed, and an oxynitride layer used as an anti-reflective coating (ARC) is formed on the surface of the polysilicon gates. Then, a photoresist layer is coated over the substrate and the oxynitride layer. A reverse mask is utilized to remove the photoresist on a major portion of the surface of the undoped polysilicon gate. A portion of the photoresist layer is etched back such that the sidewall and surface of the oxynitride layer are exposed. The oxynitride layer is dry etched, wherein the doped and the undoped polysilicon gates are protected by the remaining photoresist layer while removing the oxynitride layer. The remaining photoresist layer is removed until the surface of the substrate is exposed. Finally, the surfaces of the doped and the undoped polysilicon gates and the substrate are all cleaned.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
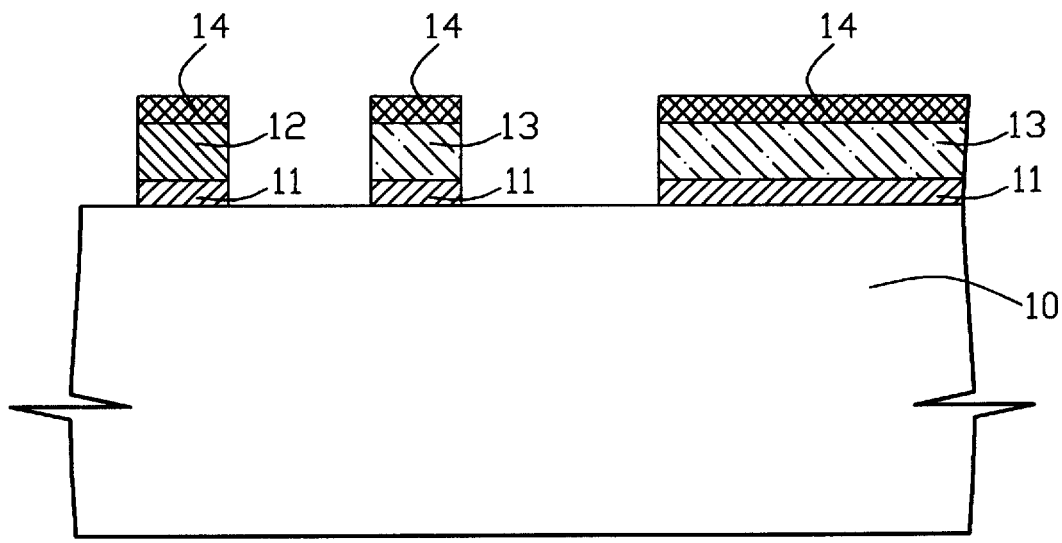
FIGS. 1A and 1B are illustrative of various components in the structure of the conventional invention.
Figure 1B:
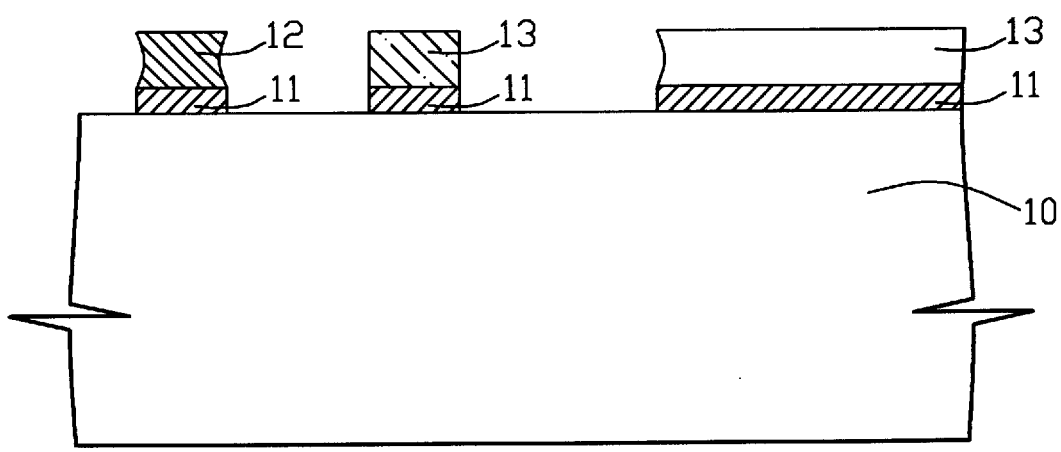

The following is a description of the present invention. The invention will firstly be described with reference to one exemplary structure. Some variations will then be described as well as advantages of the present invention. A preferred method of fabrication will then be discussed.

Moreover, while the present invention is illustrated by a preferred embodiment directed to semiconductor device, it is not intended that these illustrations be a limitation on the scope or applicability of the present invention. Thus, it is not intended that the semiconductor devices of the present invention be limited to the structures illustrated. These devices are included to demonstrate the utility and application of the present invention to presently preferred embodiments.

The spirit of the proposed invention can be explained and understood by the following embodiments with corresponding figures. With reference to FIG. 2A to 2F, according to the present invention is schematically shown to include a semiconductor substrate 20 and a plurality of gate portions.

This method for removing silicon oxynitride of polysilicon gates in fabricating integrated circuits will be the following. As FIG. 2A, semiconductor substrate 20 is provided over which doped polysilicon gate 22 and undoped polysilicon gate 23, 23-A are formed, and oxynitride layer 26 used as an anti-reflective coating (ARC) is formed on the surface of doped polysilicon gates 22 and the undoped polysilicon gates 23, 23-A.

Figure 2A:
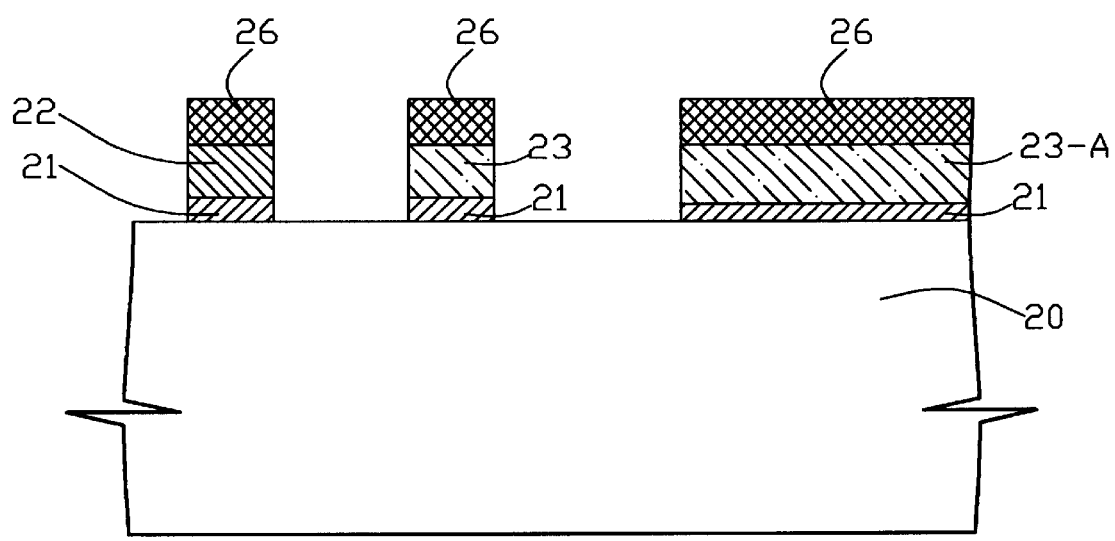
FIGS. 2A and 2F are schematic diagrams showing the structure of second embodiment of present invention
Figure 2B:
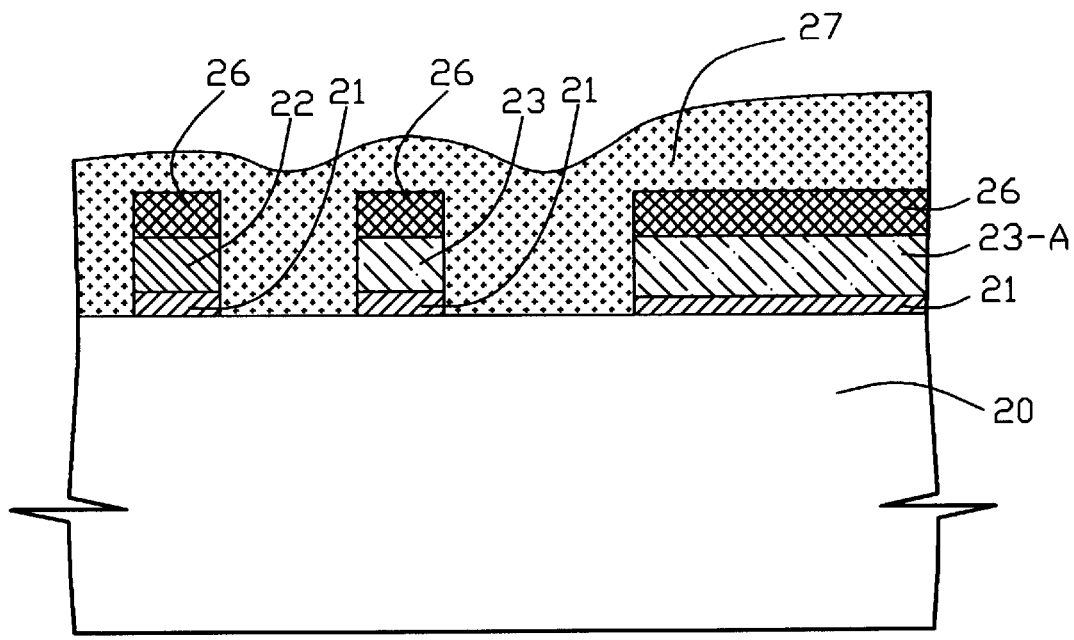

As FIG. 2B, photoresist layer 27 is coated over substrate 20 and oxynitride layer 26 by the conventional lithography.

Figure 2C:
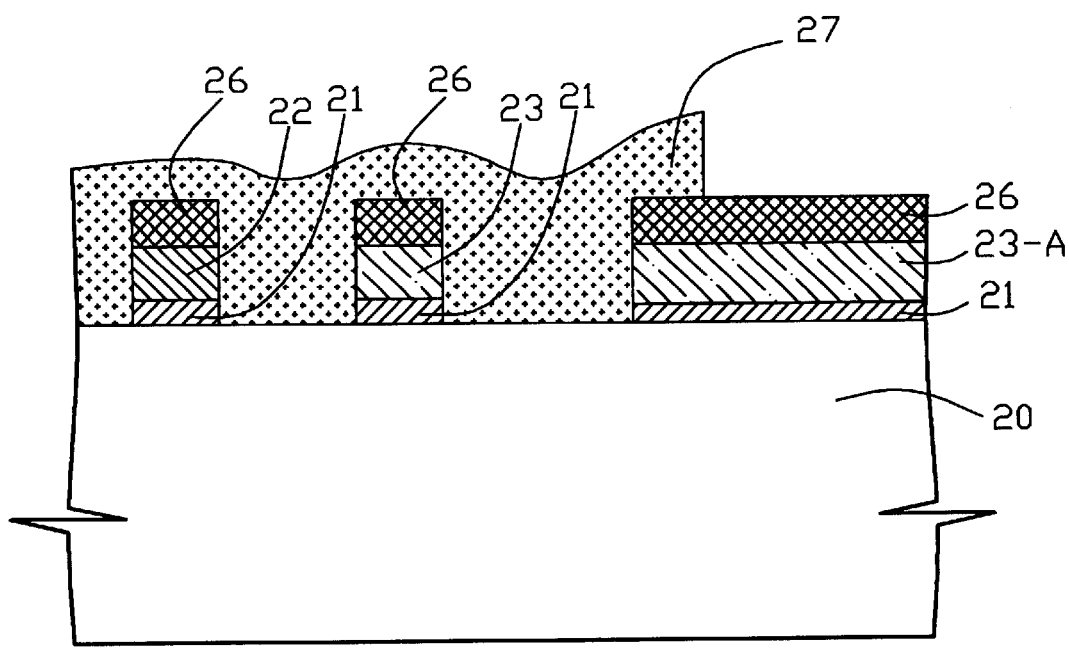

Then, as FIG. 2C, the photoresist layer 27 on a major portion of the surface of the undoped polysilicon gate 23-A is removed by the conventional etching.

Figure 2D:
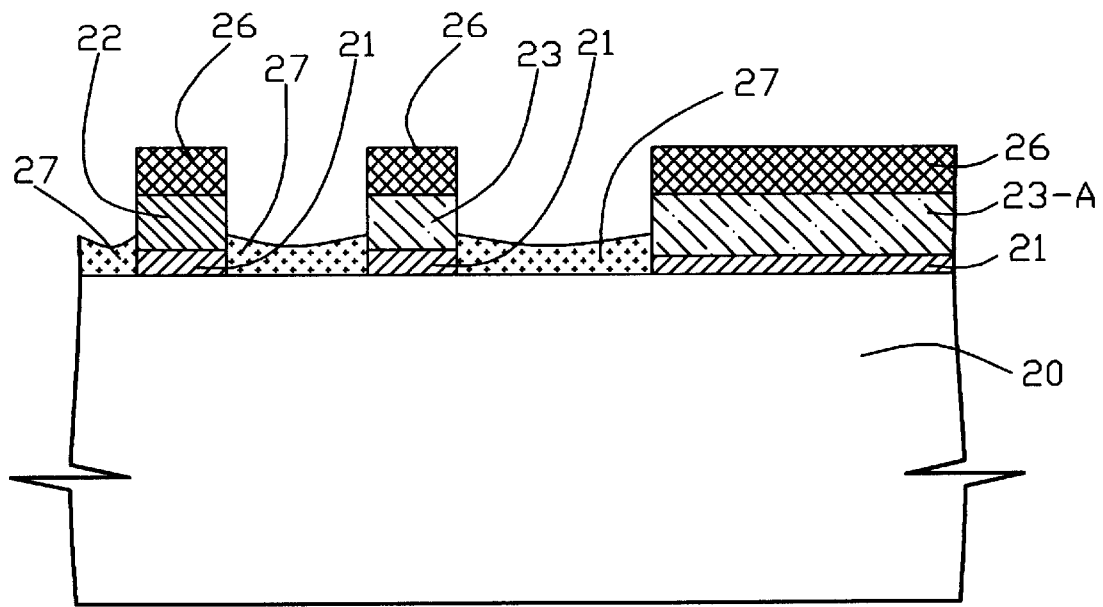

FIG. 2D shows that a portion of photoresist layer 27 is etched back by performed in a di-oxygen gas plasma such that the sidewall and surface of oxynitride layer 26 are exposed.

Figure 2E:
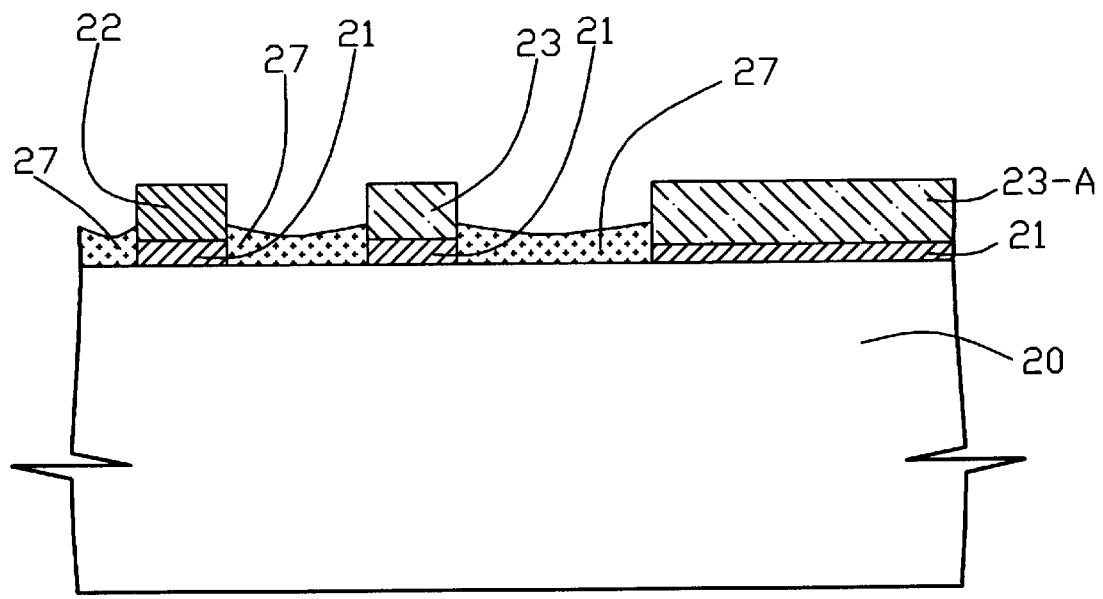

It is illustrated as FIG. 2E, oxynitride layer 26 can be dry etched by performing with $C_xF_y$ radicals, such as $CHF_3$, $CF_4$ and $C_2F_6$, the x and y represent positive integers. Especially, the doped and the undoped polysilicon gates are protected by the remaining photoresist layer while removing the oxynitride layer.

Figure 2F:
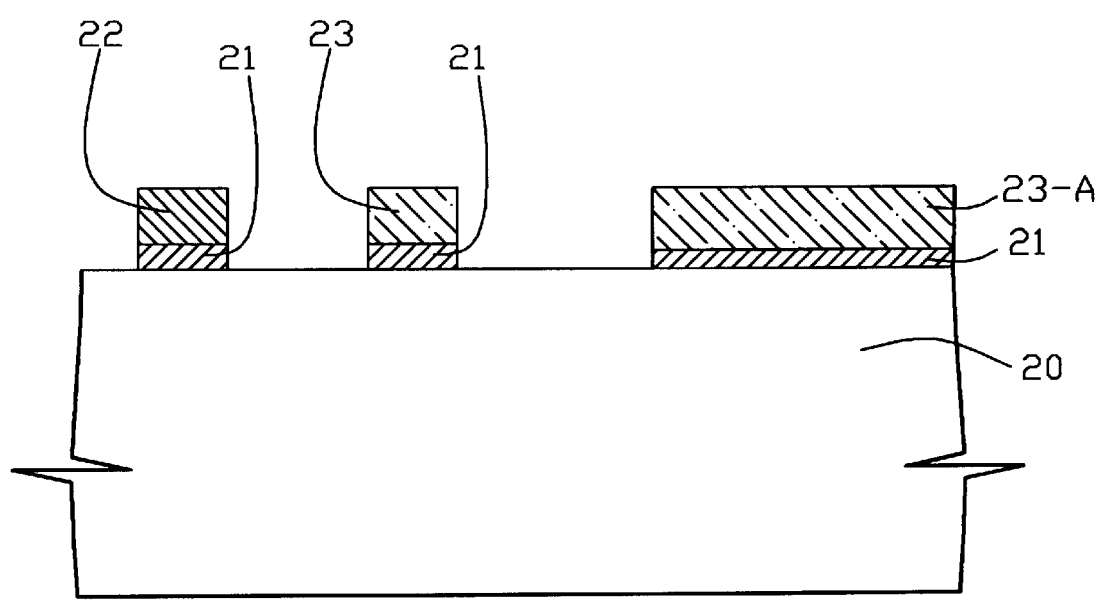

Finally, as FIG. 2F, the remaining photoresist layer 27 is removed by a dry strip process until the surface of the substrate is exposed. Surfaces of the doped and the undoped polysilicon gates and the substrate are all cleaned.

Therefore, according to the present invention, a method for removing silicon oxynitride of polysilicon gates in fabricating integrated circuits will be the following. A semiconductor substrate is provided over which a doped polysilicon gate and an undoped polysilicon gate are formed, and an oxynitride layer used as an anti-reflective coating (ARC) is formed on the surface of the doped and the undoped polysilicon gates. Then, the photoresist layer is coated over the substrate and the oxynitride layer. A reverse mask is utilized to remove the photoresist on a major portion of the surface of the undoped polysilicon gate. A portion of the photoresist layer is etched back such that the sidewall and surface of the oxynitride layer are exposed. The oxynitride layer is dry etched, wherein the doped and the undoped polysilicon gates are protected by the remaining photoresist layer while removing the oxynitride layer. Then, the remaining photoresist layer is removed until the surface of the substrate is exposed. Then, the surfaces of the doped and the undoped polysilicon gates and the substrate are all cleaned.

Although specific embodiments have been illustrated and described, it will be obvious to those skilled in the art that various modifications may be made without departing from what is intended to be limited solely by the appended claims.

What is claimed is:

1. A method for removing silicon oxynitride of polysilicon gates in fabricating integrated circuits, said method comprising:

provilding a semiconductor substrate over which a doped polysilicon gate and an undoped polysilicon gate are formed, and a silicon oxynitride layer is formed on the surfaces of said doped polysilicon gate and said undoped polysilicon gate;

coating a photoresist layer over said semiconductor substrate and said silicon oxynitride layer;

removing said photoresist layer on a major portion of the surface of said undoped polysilicon gate;

etching back a portion of said photoresist layer left over said semiconductor substrate such that the sidewall and surface of said silicon oxynitride layer are exposed;

dry etching said silicon oxynitride layer, wherein said doped polysilicon gate and said undoped polysilicon gate are protected by the remaining photoresist layer while removing said silicon oxynitride layer;

removing said remaining photoresist layer until the surface of said semiconductor substrate is exposed; and cleaning surfaces of said doped polysilicon gate, said undoped polysilicon gate and said semiconductor substrate.

2. The method according to claim 1, wherein said photoresist layer is etched back by a plasma etch.

3. The method according to claim 2, wherein said plasma etch is performed in a $O_2$ gas.

4. The method according to claim 1, wherein said step of removing said silicon oxynitride layer is performed with $C_xF_y$ radicals, wherein the x and y represent positive integers.

5. The method according to claim 1, wherein said remaining photoresist layer is removed by a dry strip process.

* * * * *